United States Patent [19]

Shokrgozar et al.

[11] Patent Number: 5,434,745
[45] Date of Patent: Jul. 18, 1995

[54] STACKED SILICON DIE CARRIER ASSEMBLY

[75] Inventors: Hamid Shokrgozar; Leonard Reeves; Bjarne Heggli, all of Phoenix, Ariz.

[73] Assignee: White Microelectronics Div. of Bowmar Instrument Corp., Phoenix, Ariz.

[21] Appl. No.: 280,315

[22] Filed: Jul. 26, 1994

[51] Int. Cl.⁶ .................... H05K 7/00; H01L 21/18
[52] U.S. Cl. ..................... 361/735; 361/744; 361/790; 257/686; 257/777; 257/693; 257/694; 437/208; 437/915; 174/52.4
[58] Field of Search ............. 361/735, 736, 744–745, 361/790, 792; 437/208, 915; 257/686, 777, 778, 690–694, 704; 174/52.3, 52.4

[56] References Cited

U.S. PATENT DOCUMENTS

| | | |
|---|---|---|
| 4,288,841 | 9/1981 | Gogal . |
| 4,398,235 | 8/1983 | Lutz . |
| 4,551,746 | 11/1985 | Gilbert et al. . |
| 4,884,237 | 11/1989 | Mueller . |
| 4,956,694 | 9/1990 | Eide . |
| 4,983,533 | 1/1991 | Go . |
| 4,996,587 | 2/1991 | Hinrichsmeyer . |
| 5,019,943 | 5/1991 | Fassbender . |
| 5,036,431 | 7/1991 | Adachi . |
| 5,043,794 | 8/1991 | Tai . |
| 5,128,831 | 7/1992 | Fox . |
| 5,165,067 | 11/1992 | Wakefield . |
| 5,222,014 | 6/1993 | Lin . |
| 5,247,423 | 9/1993 | Lin . |

FOREIGN PATENT DOCUMENTS 0160641  8/1985  Japan ................... 257/686

OTHER PUBLICATIONS

R. T. Crowley, E. J. Ver daman, "3-D Multichip Packaging for Memory Modules", 1994 ISHM Proceedings.
"Dense-Pac 3-D Technology", pp. 3494–3499 and 3505–3508 from IC Master 1993.

*Primary Examiner*—Bot L. Ledynh
*Attorney, Agent, or Firm*—Joseph W. Mott

[57] ABSTRACT

Disclosed is a stacked die carrier assembly and method for packaging and interconnecting silicon chips such as memory chips. The carrier is constructed from a metalized substrate onto which the chip is attached. The chip is wire bonded to the conductor pattern on the substrate. Each conductor then is routed to the edge of the substrate where it is connected to a half-circle of a metalized through hole. A frame is attached on top of this substrate. This frame has also a pattern of half-circle metalized through holes that aligns with the holes on the bottom substrate. The combination of the bottom substrate with the silicon die, and the frame on top, forms a basic stackable unit. Several such units can be stacked and attached on top of each other. The top unit can finally be covered with a ceramic lid that also has a matching half-circle metalized through hole pattern along its edge. To electrically interconnect the stacked assembly conductive epoxy can be applied in the grooves formed by the aligned half-circle plated through holes.

19 Claims, 3 Drawing Sheets

STACKED SILICON DIE CARRIER ASSEMBLY

FIELD OF THE INVENTION

The invention relates to packaging of semiconductor devices in general, particularly to multiple memory chips, and to stackable assemblies and interconnections thereof.

BACKGROUND OF THE INVENTION

Integrated circuit semiconductor chips are in widespread use in a great variety of both commercial grade and high-reliability applications. As the manufacturing technology progresses, more and more circuit elements can be placed on a single chip. These chips must be incorporated into a system by mounting them, ordinarily on a printed circuit board, to interconnect with the rest of the elements of the system, many of which are also semiconductor chips. Semiconductor chips are readily available in packageable form from semiconductor manufacturers, and are customarily packaged in any of a number of different enclosures to allow convenient interconnection onto the printed circuit boards, including dual in-line packages (DIPs), J-mounts, and surface mount packages, among others. To decrease the size of the overall system, it is desirable to make the printed circuit board as small as practicable, but this decreases the space available for mounting packaged chips. One solution to this dilemma is to stack chips vertically so that multiple chips can be attached to the system using the footprint area of a single chip.

Stacking of chips into multi-chip modules (MCMs) is especially advantageous in the case of memory chips, since a plurality of identical chips can be used to multiply the amount of memory available, but the principle is also applicable to other digital and analog circuits. MCMs generally contain many silicon chips densely packaged together in a metal or ceramic package that can be hermetically sealed. When constructing MCMs that are expected to perform over an extended temperature range, for example −55° C. to +125° C., it becomes important to have high confidence that each die will perform as expected. If a particular chip fails in an MCM the chip must be identified and replaced, and the entire test sequence repeated on the MCM. This is time consuming, costly, and may affect reliability. Some semi-conductor manufacturers are in the process of establishing "known good die" for use in such applications. These known good die are typically installed in sophisticated fixtures that make electrical contact with each pad on the silicon chip. The chip is then put in burn-in at elevated temperature to weed out the infant mortalities. Chips that pass this test may then be sold as "known good die." This type of test still does not guarantee that the silicon chips will meet their electrical specifications at temperature extremes, and it is therefore desirable to have a structure that permits testing at extended temperatures.

A number of approaches to packaging stacked memory chips or other circuits into modules have been developed, as generally described in "3-D Multichip Packaging for Memory Modules" by R. T. Crowley and E. J. Verdaman, as published in the Proceedings of the 1994 International Conference on Multichip Modules (sponsored by ISHM—The Microelectronics Society and The International Electronics Packaging Society). For example, in U.S. Pat. No. 4,884,237, a standard DIP packaged memory chip is "piggy-backed" onto another such chip, with the corresponding package pins in direct contact and the chip enable pins isolated by rerouting the chip enable of the upper package through an unused pin on the lower package. In U.S. Pat. No. 5,222,014, semiconductor dice are bonded to the upper surfaces of carriers and electronically coupled to the bottoms of the carriers by multi-layered connections or solder-filled through-hole vias; the combinations are then stacked with electrical interconnection between layers accomplished through solder bumps precisely aligned between the top terminal of the lower carrier and the bottom terminal of the upper carrier.

In U.S. Pat. No. 5,128,831, a semiconductor die is face bonded to a carrier substrate containing a metalization pattern that individually connects each chip bonding pad with a package interconnection pad and a substrate via on the periphery of the substrate; frame-like peripheral spacers containing holes that line up with the substrate vias are placed between pairs of die/substrate assemblies, and electrical interconnection between layers is accomplished by vacuum-assisted flowing of solder through the tubes made up of the substrate vias and the corresponding holes in the spacers. In U.S. Pat. No. 4,956,694, memory dice are bonded into the cavities of box-shaped leadless chip carriers and attached to wiring pads that are electrically connected through the carrier walls to conductive channels on the peripheral walls of the carriers; the enclosed modules are stacked and a solder interconnection between the layers is deposited on the assembly.

While all of the foregoing approaches, as well as other approaches, to multi-chip stacking are workable, each has significant disadvantages from the viewpoint of a manufacturer in the business of packaging semiconductor chips generally. The precision alignment needed for face bonding and the process controls needed for proper formation of solder bumps or vacuum flowing of solder through connection tunnels require expensive and specialized equipment.

Thus, it is one object of this invention to provide a module containing a plurality of similar dice stacked into a high density package with a small footprint.

It is another object of this invention to provide a stacked die carrier structure and method of constructing the same that employs standard bonding techniques available to chip packagers.

It is yet another object of this invention to provide a modular stacked die carrier so that individual die modules may be tested before incorporation into the overall assembly, then may be tested again when incorporated into the assembly.

SUMMARY OF THE INVENTION

The invention provides a stackable packaging module for silicon chips and a method for making the same. The silicon chip is bonded (using conventional wire bonding or other techniques) to a substrate containing metalization that connects the bonding pad to terminals on the periphery of the substrate. A spacer frame with notches matching the shape and location of the substrate peripheral terminals is adhesively mounted to the substrate. This unit can be tested at temperature extremes, burned-in and re-tested if desired. A second unit, similarly constructed and tested, is then adhesively mounted on top of the first one, with its spacer frame notches and substrate terminals aligned. This stacking process can be repeated several times, and the final top unit may have a lid adhesively attached to it. Conductive epoxy is then be applied in the grooves formed by the aligned substrate terminals and spacer frame notches to interconnect each stackable unit. This forms a completed assembly that can be adhesively secured in a hermetic MCM package. The assembly can also be attached to a lead frame, molded, or fitted with a plastic cover. By stacking each basic unit that contains a silicon chip, a very small footprint, high density module can be fabricated.

Principal advantages of this design are that it can be fabricated with conventional packaging technology and during assembly each basic unit can be pre-tested before another pre-tested unit is adhesively mounted on top of the first one.

This technology is applicable to any type of silicon chips, but lends itself to packaging of memory chips. Memory chips such as SRAM (Static Random Access Memory), DRAM (Dynamic Random Access Memory), EEPROM (Electrically Erasable Programmable Read Only Memory), and FLASH PROM can have their Data lines, Address lines, Output Enable lines, and Write Enable lines connected in parallel, while the Chip Enable line of each memory chip is individually brought out to the external connection. Thus each basic stackable unit can have identical metalized patterns, be identically wire bonded, and jumper wire bonds can be selectively removed after testing a single unit, to bring out each Chip Enable line on a different edge connection. This is suitable for high volume production. Alternatively, the Output Enable or Write Enable lines of each memory chip may also be brought out to individual edge connections rather than be connected in parallel to the other chips in the stack. These and other features, and advantages, will be more clearly understood from the figures and the detailed description following. The illustrations may not be drawn to scale, and there may be other embodiments of this invention that are not specifically illustrated.

DETAILED DESCRIPTION OF THE INVENTION

Figure 1:
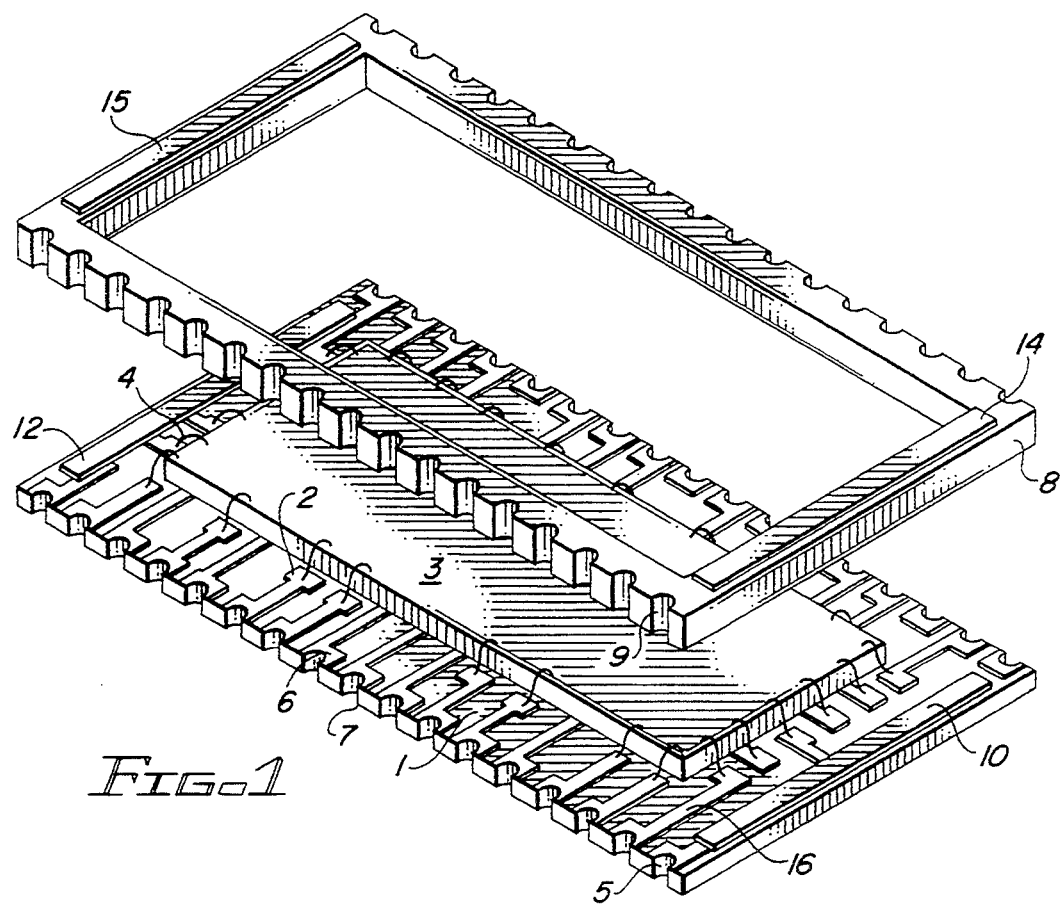
FIG. 1 shows a basic stackable unit. It consists of a metalized base substrate, onto which a silicon chip is mounted and wire bonded. A frame is epoxy attached on top of this base substrate.

FIG. 1 shows the basic module used in one embodiment of the invention. A base substrate 1 is fabricated. The material of this substrate is chosen to have a thermal coefficient of expansion close to that of silicon. Such a material can be 96% alumina ceramic substrate material. Other materials, such as aluminum nitride and beryllia, can also be used as is well known in the art. The base substrate 1 is metalized with a defined pattern to individually interconnect a wire bonding pad 2 at one end of the metal with a metalized pad at the edge of the substrate 6. Each metalized pad 6 is electrically connected to one half of a metalized hole 5. The bottom side of the substrate also has a metalized pad around each metalized half-hole 7. The metalized pad, half metalized hole and bottom side pad comprise an edge connector.

Figure 2B:
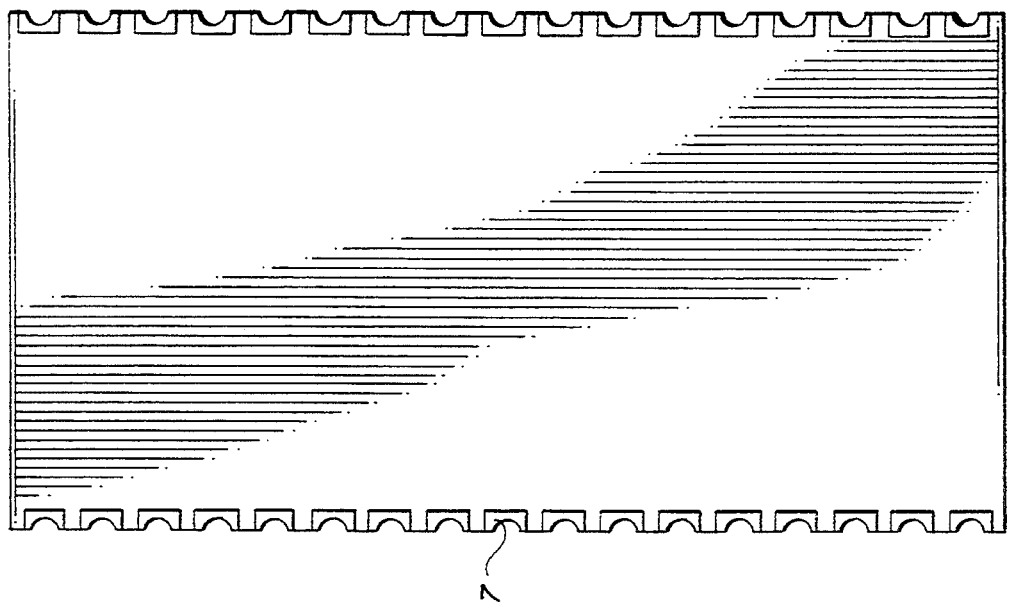
FIGS. 2a and 2b show the top and bottom of a metalized substrate to be used when creating a stacked module of SRAM chips such as the Micron MTSC1008.
Figure 2A:
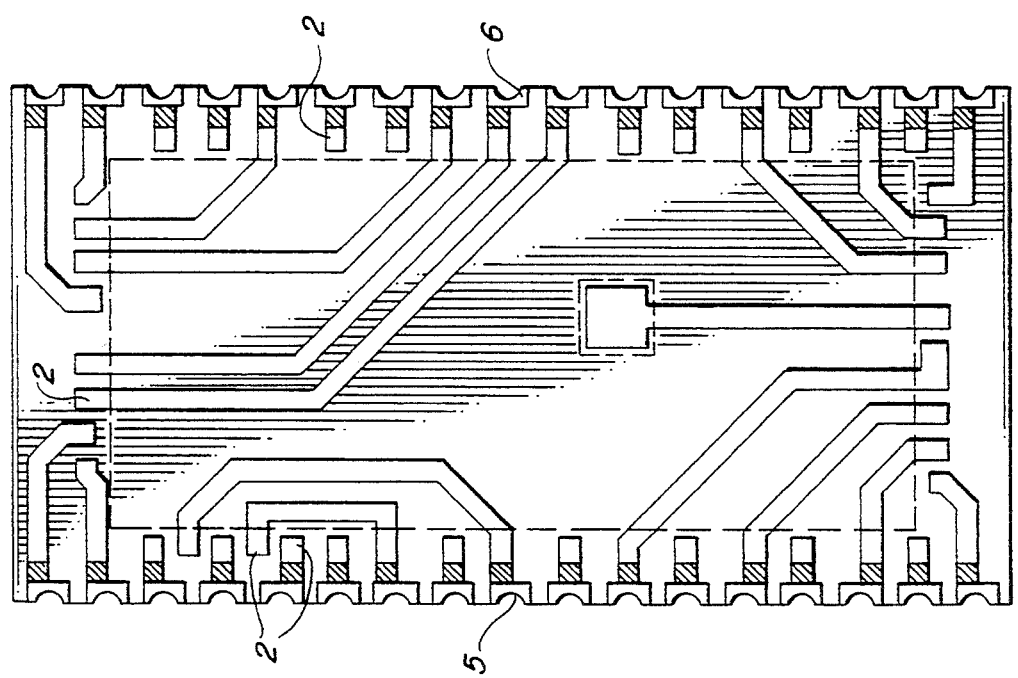

An example of a typical metalization pattern is shown in FIGS. 2a and 2b, representing the top and bottom views, respectively, of a base substrate. This pattern is suitable for use with an SRAM memory chip inasmuch as the wire bonding pads 2 are located near where the corresponding chip bonding pads of the SRAM die will rest. The appropriate metalization pattern will be determined by the bonding pad distribution on the die to be mounted and the desired locations on the periphery to which each die terminal is to be electrically connected. The metalization used is generally thick film gold or silver, but not limited to these materials. The through plated half hole is a convenient and effective shape for the substrate edge connector, but other shapes such as U-, V-, or half rectangle-shaped notches may also be employed. It is also not necessary to metalize the vertical surface of the notches, but such metalization improves the inter-layer electrical connection.

One advantageous way of fabricating the substrate is by through-plating holes of approximately 0.012 inch diameter, spaced at approximately 0.0425 inches on center, in parallel, spaced rows on a 2 inch by 2 inch snapstrate of 0.015 inch thick 96% alumina ceramic. The snapstrate can be scored and separated through the centers of the holes, leaving substrate pieces with through plated half-holes of uniform size and spacing. Eight substrate pieces, each approximately 0.73 inches long and 0.38 inches wide, are formed from a single snapstrate in this manner, with the through-plated half-holes spaced along the larger sides.

Referring again to FIG. 1, a silicon die 3 is then attached to the substrate 1 using epoxy or other standard methods. Although only one die is shown, two or more dice may be attached to a single substrate as appropriate. This epoxy may be electrically conductive or non-conductive depending on whether the back side of the chip is to be electrically tied to an edge connector. Generally, conductive epoxy such as Epo-Tek H-35 epoxy may be applied using an epoxy dispensing machine. The silicon die 3 can then be placed on top, and the substrate and chip is cured for 90 minutes at 165° C.

The chip is then wire bonded 4 to the metalized pattern on the substrate 2 using standard wire bonding techniques. The wire bond generally is 1 mil gold wire used with thermo compression or thermosonic wirebonders, or 1 mil aluminum wire used with ultrasonic wirebonders. The wire bonding is not limited to the foregoing techniques, however, and may be accomplished in other ways such as TAB bonding or Flip chip bonding.

On top of this base substrate a frame 8 is aligned. The material of this frame should have a thermal coefficient of expansion close to that of the base substrate, and may be the same material as that of the base substrate. The edge of the frame has a row of one half of metalized holes 9 in this embodiment. If the notches in the base substrate are a different shape, the metalized notches in the frame match such shape. The thickness of the frame is chosen such that it is greater than the thickness of the silicon chip 3 and the height of the wire bond 4 or other attachment structure. A frame thickness of approximately 0.031 inches is satisfactory when using a Micron SRAM die and gold thermosonic wire bonding. This protects the chip and the wire bonds after the frame 7 is attached to the base substrate 1.

The frame 8 is attached to the base substrate 1 with non-conductive epoxy in the end areas 10 and 12 and cured. This non-conductive epoxy may be Epo-Tek H-65 type with a curing time of 90 minutes at 165° C. The frame is aligned with its notches 9 corresponding to the notches of the base substrate 5. The base substrate 1 with the attached and wire bonded chip 3 and the attached frame 8 forms the main building block of the invention, shown as 17 in FIGS. 3 and 4. This building block 17 can be tested using a test fixture that makes contact to the metalization 6a of the bottom of the base substrate. Testing can include temperature tests and burn-in to weed out the infant mortalities.

Figure 3:
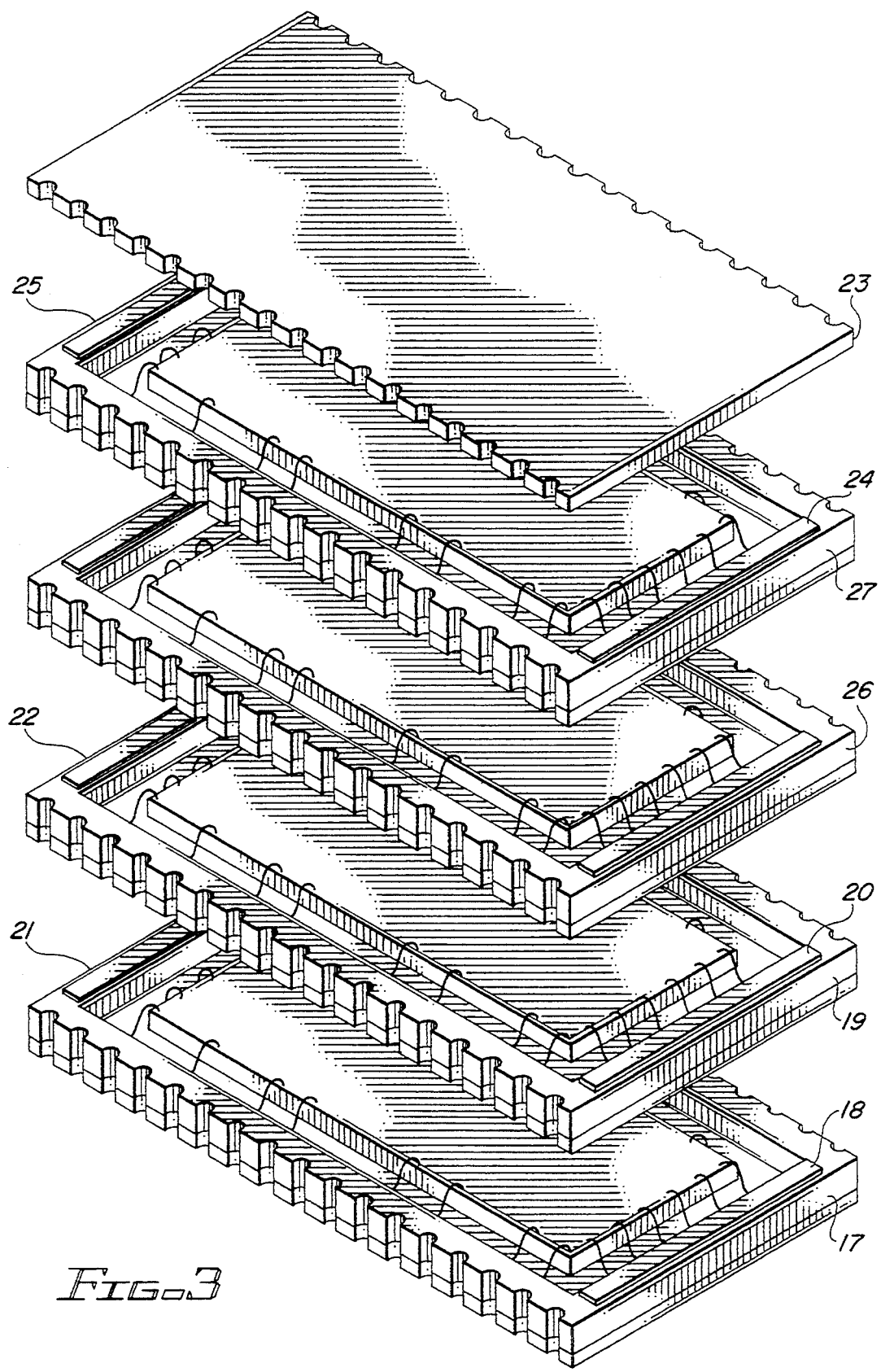
FIG. 3 shows an exploded view of four basic stackable units aligned for assembly into an MCM. Four die stacked is chosen for illustration only, and any number of units may be stacked on top of each other.

As illustrated in FIG. 3, another building block can then be attached to building block 17 using non-conductive epoxy applied in the areas at the ends of the top surface of the frame, as shown at 18 and 21. The epoxy type and curing time may be the same as previously mentioned. Subsequently yet another building block 26 can be attached on top of 19 using non-conductive epoxy in the areas shown at 20 and 22 and cured. This stacking process can be repeated several times. FIG. 3 shows as an example an exploded view of four such building blocks. On top of the last building block 27 a lid 23 may be attached using non-conductive epoxy in the areas shown at 24 and 25. The lid material is chosen to have a thermal coefficient of expansion close to that of the frame 8 of the top building block 27. Generally the material of the lid 23 is the same as that of the frame 8. The lid may optionally include groves matching those in the top spacer frame. Depending on the application, it may be desirable to encase the entire stacked module in a hermetically-sealed package, in which case no lid would be needed.

Figure 4:
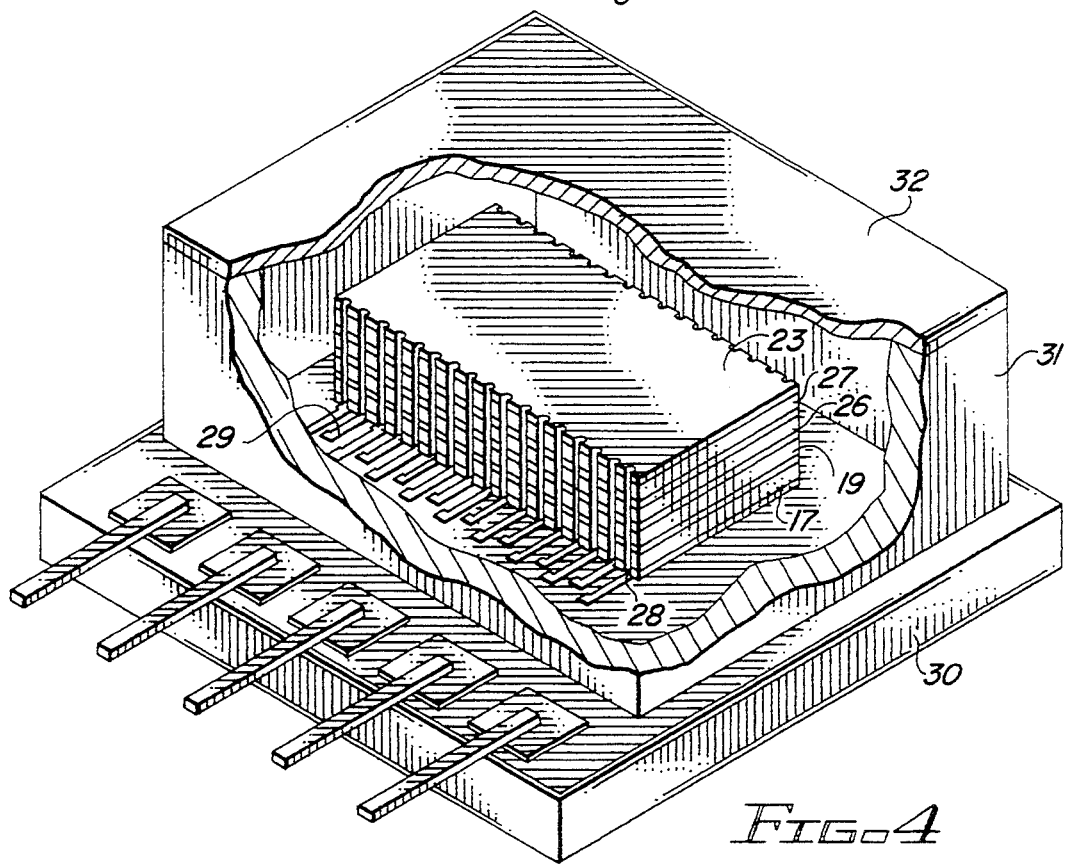
FIG. 4 shows four units stacked and epoxied together, with a lid attached to the top, and the entire stack mounted in a flat pack assembly.

FIG. 4 shows as an example a finished four layer stack made from building blocks 17 19 26 and 27 with a lid 23 assembly. Conductive paste epoxy 28, such as Epo-Tek H-35, is applied in the elongated groove formed by the through plated half holes that are on top of each other in the embodiment shown. The conductive epoxy serves as an electrical conductor between each layer, and also as an additional adhesive between each layer. One mounting option is also shown in FIG. 4. The stack is attached to a standard flat pack assembly 30 for attaching it electrically and physically to a larger system. The grooves with conductive epoxy 28 are aligned with and electrically connected to attachment pads 29 of the flat pack. The flat pack assembly's enclosure 31 also includes a lid 32 which is attached after the stack is in place.

The building-block design lends itself to various advantageous fabrication techniques, depending upon the particular application to which the intention is adopted. For example, it may be desirable in some applications to test the MCM as each building block is added to the overall structure, rather than just test the completed MCM. In such a case, each individual building block may be tested as mentioned before. After two building blocks are attached together, and before a third is attached, the conductive epoxy 28 can be applied and the unit tested as a 2-chip module. A third building block may be attached, additional conductive epoxy extended to that module's peripheral contacts, and testing performed on the 3-chip module. This sequential testing may be repeated until all the desired building blocks are connected.

The invention also lends itself to efficient volume production of stacked memory modules. For example, when identical memory dice are to be stacked, all of the external connections of a die, except for Chip Enable, may be connected in parallel with the corresponding external connections from the other dice in the stack. Then, by defining a base substrate metalization pattern and a bonding pattern such that Chip Enable is jumpered to a predefined number of unique edge connectors, it is possible to use the identical substrate metalization and bonding pattern for fabricating and testing all building blocks in the stack. Selective cutting of jumper wire bonds to leave Chip Enable in contact with a preselected unique edge connector may be performed immediately before a building block is attached to a stack.

Although the present invention has been described in considerable detail with reference to certain preferred versions thereof, other versions are possible. For example multiple dice may be mounted side-by-side on a substrate to form one or more of the building blocks. Different types of die may also be stacked, such as several levels of memory dice and one or more levels of, for example, buffers, drivers or decoder chips. Therefore, the spirit and scope of the appended claims should not be limited to the description of the preferred versions contained herein.

What is claimed is:

1. A stacked carrier assembly for packaging and interconnecting a plurality of semiconductor dice, comprising (1) a plurality of modules adhesively stacked one atop another, each module comprising a rectangular base substrate having a plurality of notches spaced along at least one edge thereof, a metalized edge connector at each notch, and a metalization pattern on the substrate comprising a plurality of connections between the edge connectors and a plurality of substrate bonding pads; at least one semiconductor die adhesively affixed to the base substrate, said die containing circuitry and a plurality of chip bonding pads; a plurality of interconnections between the chip bonding pads and the substrate bonding pads; and a spacer frame adhesively affixed to the base substrate, having a plurality of notches along at least one edge corresponding in size, shape and location to the notches in the base substrate;

(2) an electrically conductive adhesive applied to the notches in the stacked modules to interconnect the modules by their edge connectors; and (3) a connection means for attaching the assembly electrically and physically to a system.

2. The assembly of claim 1 further including a lid adhesively attached to the uppermost module.

3. The assembly of claim 2 wherein the lid includes a plurality of metalized notches along at least one edge corresponding in size, shape and location to the notches in the spacer frame to which it is attached.

4. The assembly of claim 1 wherein the notches are metalized.

5. The assembly of claim 1 wherein the notches are semicircular.

6. The assembly of claim 4 wherein the notches are semicircular.

7. The assembly of claim 5 wherein the entire assembly is hermetically sealed.

8. The assembly of claim 6 wherein the entire assembly is hermetically sealed.

9. The assembly of claim 1 wherein the entire assembly is hermetically sealed.

10. The assembly of claim 1 wherein the semiconductor dice are identical memory chips, each having a Chip Select chip bonding pad, the metalization pattern on each base substrate is the same, and the interconnections between the chip bonding pads and the substrate bonding pads are the same for each module, except that for each module the Chip Select chip bonding pad is connected to a substrate bonding pad leading to a unique edge connector.

11. The assembly of claim 6 wherein the semiconductor dice are identical memory chips, each having a Chip Select chip bonding pad, the metalization pattern on each base substrate is the same, and the interconnections between the chip bonding pads and the substrate bonding pads are the same for each module, except that for each module the Chip Select chip bonding pad is connected to a substrate bonding pad leading to a unique edge connector.

12. The assembly of any one of claims 1 through 11 wherein the connection means is a dual in-line package assembly.

13. The assembly of any one of claims 1 through 11 wherein the connection means is a flat pack assembly.

14. A stacked carrier assembly for packaging and interconnecting a plurality of semiconductor memory dice, comprising (1) a plurality of modules adhesively stacked one atop another, each module comprising a rectangular base substrate having a plurality of semicircular notches spaced along at least one edge thereof, a metalized edge connector at each notch, and a metalization pattern on the substrate comprising a plurality of connections between the edge connectors and a plurality of substrate bonding pads; at least one memory die adhesively affixed to the base substrate, said die containing circuitry and a plurality of chip bonding pads; a plurality of wire bond interconnections between the chip bonding pads and the substrate bonding pads; and a spacer frame adhesively affixed to the base substrate, having a plurality of metalized notches along at least one edge corresponding in size, shape and location to the notches in the base substrate;

(2) a rectangular lid adhesively attached to the top of the spacer frame in the uppermost module, said lid having a plurality of metalized notches along at least one edge corresponding in size shape and location to the notches in the spacer frame to which it is attached;

(3) electrically conductive epoxy applied to the notches in the stacked modules to interconnect the modules by their edge connectors; and (4) connection means for attaching the assembly electrically and physically to a system.

15. The assembly of claim 14 wherein the semiconductor dice are identical memory chips, each having a Chip Select chip bonding pad, the metalization pattern on each base substrate is the same, and the interconnections between the chip bonding pads and the substrate bonding pads are the same for each module, except that for each module the Chip Select chip bonding pad is connected to a substrate bonding pad leading to a unique edge connector.

16. A method of fabricating a stacked die carrier assembly comprising the steps of a. fabricating a plurality of modules, each module made by fabricating a base substrate having a plurality of notches spaced along at least one edge thereof; metalizing the base substrate with a predetermined pattern of connections between a plurality of edge connectors located at the notches and a plurality of substrate bonding pads;

affixing to the base substrate at least one semiconductor die containing circuitry and a plurality of chip bonding pads;

connecting selected ones of the substrate bonding pads to selected ones of the chip bonding pads;

affixing to the base substrate a spacer frame having a plurality of notches along at least one edge corresponding in size, shape and location to the notches in the base substrate;

b. adhesively stacking at least two modules together, one on top of the other, with their corresponding notches aligned;

c. applying an electrically conductive adhesive to the notches in the stacked modules to interconnect the modules by their edge connectors; and d. attaching the stacked assembly to a connection means for electrical and physical attachment to a system.

17. The method of claim 16 further including the step of attaching a lid to the uppermost module.

18. The method of claim 16 further including the step of encasing the assembly in a hermetically sealed package.

19. The method of any one of claims 16 through 18 further comprising the steps of testing each module after it is fabricated and before it is attached to another module; and testing the assembly after an additional module is attached to it.

* * * * *